United States Patent [19]

Janes et al.

[11] 4,287,507

[45] Sep. 1, 1981

[54] TOPOGRAPHY FOR INTEGRATED CIRCUIT PATTERN RECOGNITION ARRAY

[75] Inventors: Michael M. Janes, Colorado Springs; Rodney H. Orgill, Woodland Park, both of Colo.

[73] Assignee: NCR Corporation, Dayton, Ohio

[21] Appl. No.: 43,929

[22] Filed: May 30, 1979

[51] Int. Cl.³ .............................................. G06K 7/14
[52] U.S. Cl. ............................ 340/146.3 Z; 235/463
[58] Field of Search ................ 340/146.3 Z, 146.3 R; 235/463, 454; 364/488, 489, 490, 491, 515

[56] References Cited

U.S. PATENT DOCUMENTS

| | | | |
|---|---|---|---|
| 4,108,368 | 8/1978 | Dobras | 340/146.3 Z |
| 4,140,271 | 2/1979 | Nojiri et al. | 235/463 |
| 4,146,782 | 3/1979 | Barnich | 235/463 |
| 4,147,295 | 4/1979 | Nojiri et al. | 235/463 |

Primary Examiner—Leo H. Boudreau
Attorney, Agent, or Firm—J. T. Cavender; Philip A. Dalton

[57] ABSTRACT

An integrated circuit for sequentially receiving a plurality of binary interval numbers, each representing the width of a time interval occurring during optical scanning of a bar coded label, includes first, second, third and fourth sequentially located edges forming a rectangle. The integrated circuit includes input logic circuitry for receiving and temporarily storing the binary interval numbers and a plurality of adders and shift registers for adding predetermined ones of the stored binary interval numbers and storing the resulting sums. The integrated circuit includes a plurality of comparators for comparing predetermined ones of the sums and stored sums to produce a plurality of intermediate signals. Encoding circuitry encodes predetermined ones of the intermediate logic signals to produce a digital character number representing a character scanned on the bar coded label and also includes output circuitry. The input logic circuitry is located adjacent to the first edge, and the plurality of comparator circuits are located generally along the third edge. The shift register and adder circuitry is generally located between the input logic circuitry and the plurality of comparator circuits. The encoder circuitry is located generally adjacent the fourth edge of the chip. The output circuitry is generally located adjacent the third edge.

7 Claims, 12 Drawing Figures

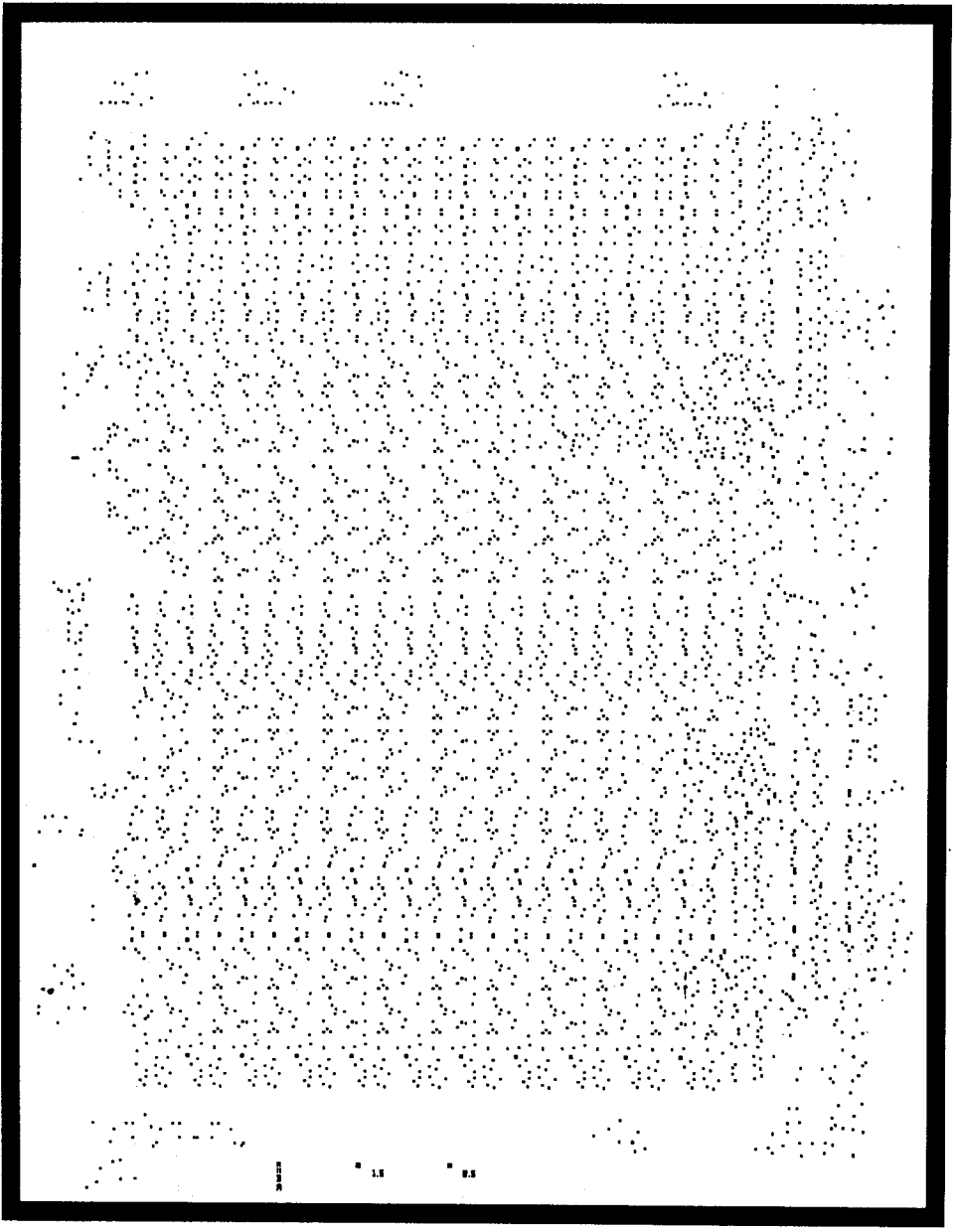
FIG. 6 N+ TO POLY CONTACTS

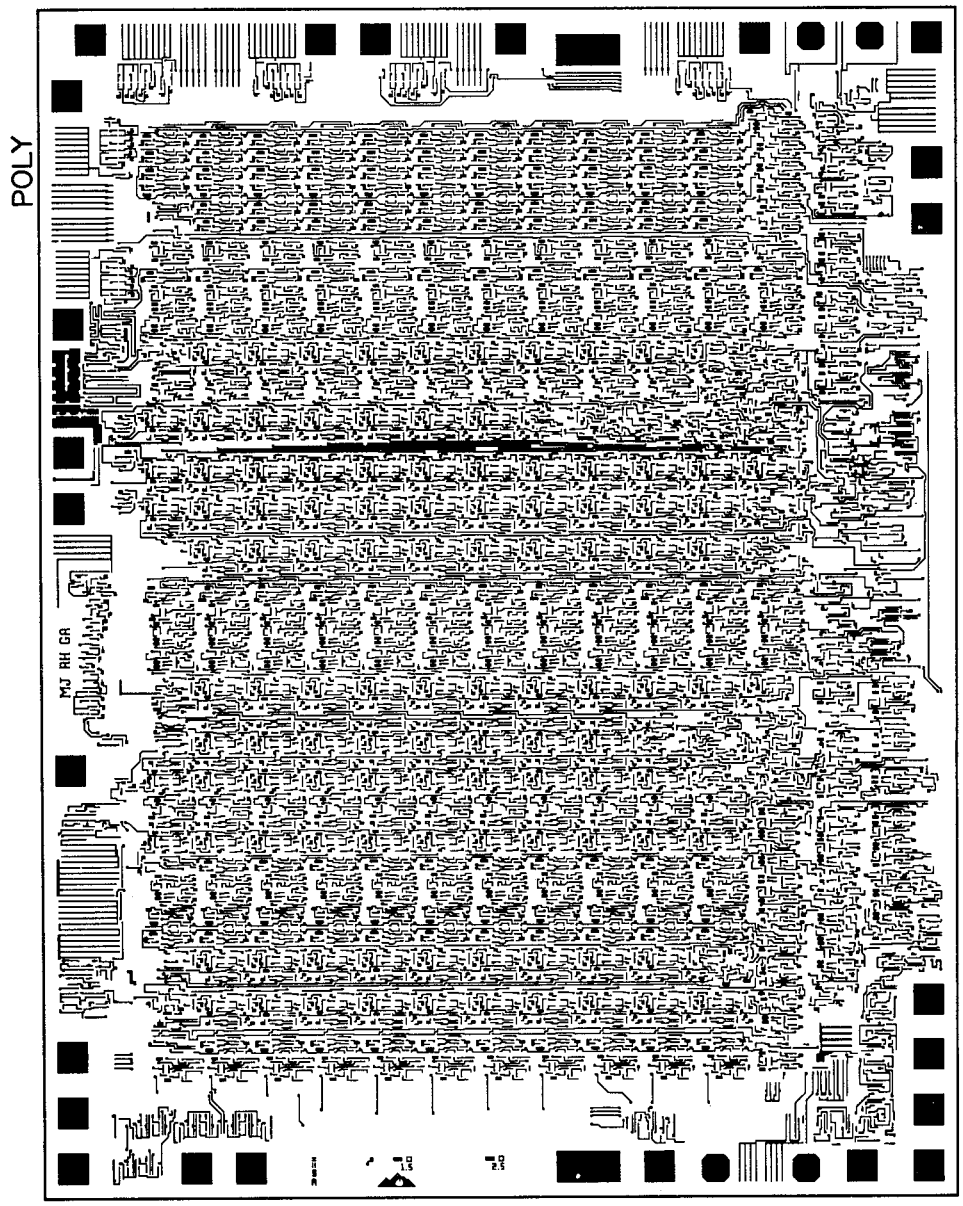

CONTACTS

FIG. 11

| Pin | Name | Type | | Type | Pin | Name |
|---|---|---|---|---|---|---|
| 1 | VSS | P | | IN | 24 | D0 |
| 2 | D1 | IN | | IN | 23 | D2 |
| 3 | D3 | IN | | IN | 22 | D4 |
| 4 | D6 | IN | | IN | 21 | D5 |
| 5 | D7 | IN | | IN | 20 | CLK |
| 6 | D8 | IN | | IN | 19 | Ø2 |
| 7 | D9 | IN | | O | 18 | LEDCLK |
| 8 | D10 | IN | | O | 17 | PARITY |
| 9 | VIDEO | IN | | O | 16 | BCD3 |
| 10 | MARK | O | | O | 15 | BCD2 |
| 11 | EQUAL | O | | O | 14 | BCD1 |
| 12 | VCC (+5) | P | | O | 13 | BCD0 |

IN = INPUT
O = OUTPUT
P = POWER

TOPOGRAPHY FOR INTEGRATED CIRCUIT PATTERN RECOGNITION ARRAY

BACKGROUND OF THE INVENTION

1. Field of the Invention

The invention relates to integrated circuits for economically processing digital information produced in response to optical scanning of bar coded labels.

2. Description of the Prior Art

The size of an integrated circuit, i.e., the "chip size", is an important factor in the ultimate cost of the integrated circuit to the final user. Another important cost is the engineering and design cost. The larger the number of units of the integrated circuit which are manufactured, the smaller are the engineering and design costs per unit. However, the chip size becomes an increasingly dominant factor in the ultimate product cost as the manufacturing volume of the product increases. For state of the art MOS (metal-oxide-semiconductor) large scale integrated (LSI) devices, very large numbers of MOSFETS (metal-oxide-semiconductor field effect transistors) are fabricated on a single monolithic silicon "chip" which is frequently less than 250 mils square. Thousands of conductive lines, some composed of polycrystalline silicon and others composed of aluminum, interconnect the various elements of the MOSFETS. Minimum line widths and spacings between the respective lines and the MOSFETS must be maintained to avoid short circuits and parasitic effects. Yet the length of the interconnecting lines and their associated capacitances must be minimized not only to reduce chip size, but also to achieve maximum circuit operating speeds. A wide variety of trade-offs, including the necessity to minimize chip size, increase circuit operating speed, reduce power consumption, and achieve acceptable reliability are involved in obtaining an optimum "layout" or arrangement of MOSFETS and interconnection pattern therebetween in order to obtain a MOSLSI circuit which is both economical and has acceptable operating characteristics. Often, the technical and commercial success of an electronic product utilizing MOSLSI technology may hinge on the ability of the chip designer to achieve an optimum chip topography.

A very high level of creative interaction between the circuit designer and the chip designer or layout draftsman is required to achieve a chip topography or layout which enables the integrated circuit to have acceptable operating speed and power dissipation and yet is sufficiently small to be economically feasible. Months of such interaction resulting in numerous trial layout designs and redesigns and circuit design revisions may be required to arrive at an optimum topography for a single MOSLSI chip. Although the computer aided design (CAD) approach in the past has been attempted in order to generate optimum MOSLSI topography designs, this approach has been only moderately successful, and only to the extent that the CAD approach sometimes provides a rapid chip topography design. However, such a topography design usually has mediocre performance and usually results in unduly large, uneconomical semiconductor chips. It is well established in the integrated circuit industry that CAD approaches to generating MOSLSI chip layouts do not yet come close to achieving the topography design optimization which can be accomplished by human ingenuity applied to the task.

Some of the numerous design constraints faced by the MOSLSI chip designer include specifications for the minimum widths and spacing of diffused regions in the silicon, the minimum size required for contact openings in the insulating field oxide, the spacings required between the edges of contact openings to the edge of diffused regions, minimum widths and spacing of polycrystalline silicon conductors, the fact that such polycrystalline silicon conductors cannot "cross over" diffused regions, the minimum widths and spacings between the aluminum conductors, and the constraint that conductors on the same layer of insulating oxide cannot cross over like conductors. The high amount of capacitance associated with diffused regions and the resistances of both diffused regions and the polycrystalline silicon conductors must be carefully considered by the circuit designer and the chip designer in arriving at an optimum chip topography.

For many types of logic circuits, such as those in the present invention, a very large number of conductive lines between sections of the logic circuitry are required. The practically infinite number of possibilities for routing the various conductors and placing the various MOSFETS taxes the skill and ingenuity of even the most skillful chip designers and circuit designers, and is beyond the capability of the most sophisticated computer programs yet available.

Other constraints faced by the chip designer and circuit designer involve the need to minimize cross coupling and parasitic effects which occur between various conductive lines and conductive regions. Such effects may degrade voltages on various conductors, leading to inoperative circuitry or low reliability operations under certain operating conditions.

Accordingly, it is an object of the present invention to provide an integrated circuit pattern recognition array for processing digital signals produced in response to optical scanning of a bar coded label, which integrated circuit has a topography which provides maximum possible circuit operating speed with lowest possible chip size and power dissipation.

SUMMARY OF THE INVENTION

Briefly described, and in accordance with one embodiment thereof, the invention provides an integrated circuit for sequentially receiving a plurality of binary interval numbers, each representing the width of a time interval occurring during optical scanning of a bar coded label. The integrated circuit receives a plurality of signals, each representing whether a respective one of the time intervals is a bar or a space. The integrated circuit includes input circuitry for receiving and storing the received binary interval numbers and a sub-array of shift register circuitry and adder circuitry for adding predetermined ones of the stored binary interval numbers and storing the resulting sums. A block of comparator circuitry receives and compares predetermined ones of the sums and stored sums to produce a plurality of intermediate signals. The intermediate signals are encoded by means of encoding circuitry to produce a digital character representing a character scanned on the bar coded label. The integrated circuit includes output circuitry for outputting the digital character number. The integrated circuit includes first, second, third and fourth sequentially located edges forming a rectangle. The input circuitry generally is located adjacent to the first edge of the integrated circuit. The block of comparator circuitry generally is located adjacent to the third edge of the integrated circuit. The array of shift register circuitry and adder circuitry generally is located between the input circuitry and the block of comparator circuits. The output circuitry generally is located immediately adjacent the third edge, between the third edge and the block of comparator circuitry.

BRIEF DESCRIPTION OF THE DRAWINGS

FIG. 6 is a scale reproduction of a photomask utilized to define the pattern of contacts between the polycrystalline silicon conductors and the diffused regions of the integrated circuit of the present invention.

FIG. 7 is a scale reproduction of a photomask utilized to define the pattern of the polycrystalline silicon layer of the integrated circuit of the present invention.

FIG. 11 is a diagram illustrating the package and lead configuration of the package in which the integrated circuit of the present invention is ultimately housed.

DESCRIPTION OF THE INVENTION

The invention described herein is closely related to the disclosure in the patent application entitled "SYMBOL DECODING SYSTEM", by Gene L. Amacher and Syed Naseem, Ser. No. 043,933, filed May 30, 1979, the patent application entitled "SYMBOL PROCESSING SYSTEM", by Denis M. Blanford and Syed Naseem, Ser. No. 043,971 filed May 30, 1979, the patent application entitled "SLOT SCANNING SYSTEM", by Gene L. Amacher, Syed Naseem and Denis M. Blanford, Ser. No. 043,928, filed May 30, 1979, and the patent application entitled "TOPOGRAPHY FOR INTEGRATED CIRCUIT FRAME CONTROL ARRAY", by Harry N. Gardner and Wayne Gravelle, Ser. No. 043,930, filed May 30, 1979, all assigned to the present assignee, all filed on even date herewith, and all incorporated herein by reference.

The logic circuitry on the integrated circuit chips having the topography described herein is described in great detail in the above mentioned co-pending patent application identified by Ser. No. 043,933. The block diagrams of FIGS. 1 and 2 herein are identical to FIGS. 6 and 7 in the co-pending patent application identified by Ser. No. 043,933; the corresponding description thereof has been repeated herein for the convenience of the reader.

Figure 1:
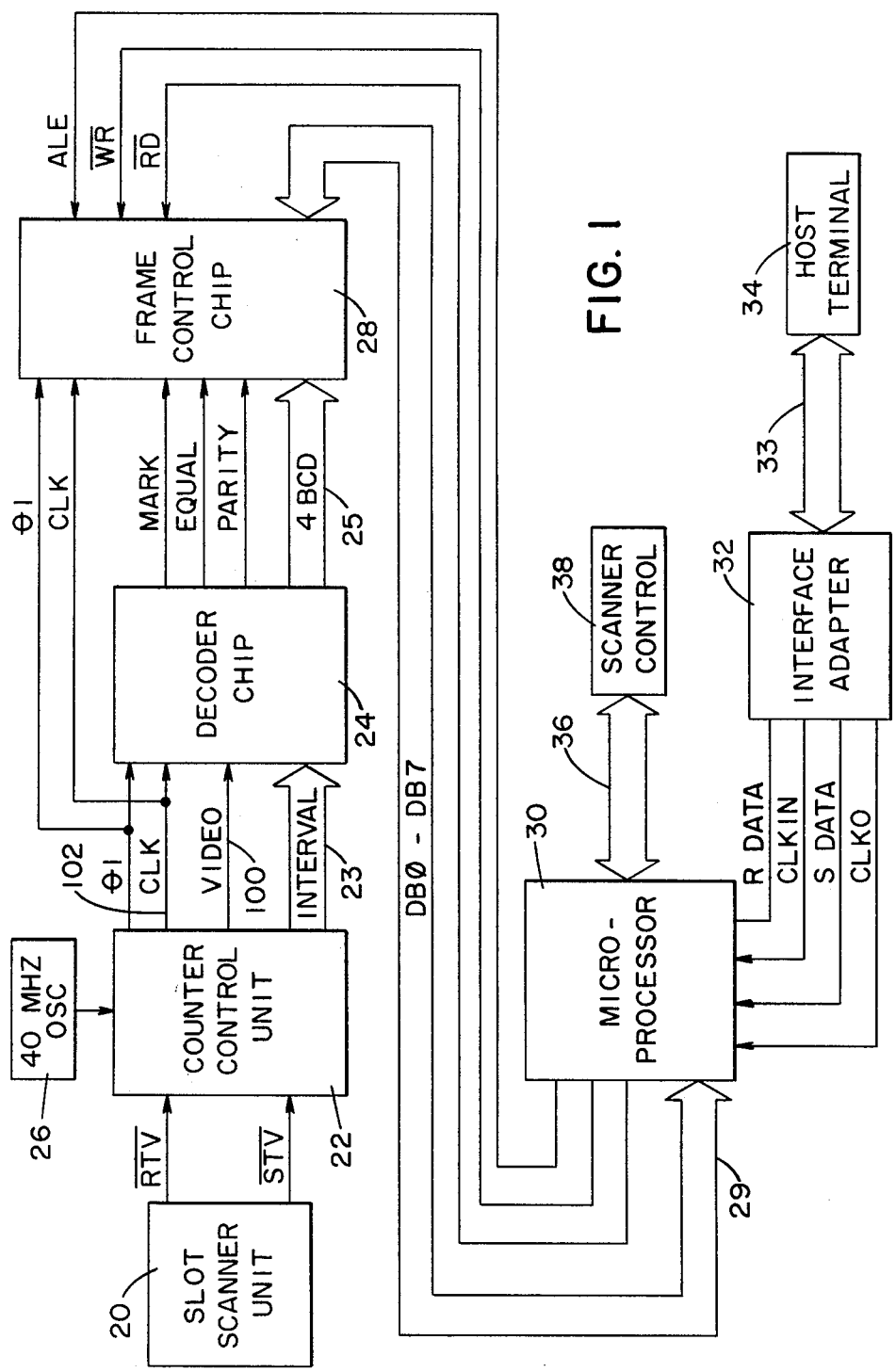
FIG. 1 is a block diagram of a bar coded label scanning and pattern recognition system in which the integrated circuit of the present invention is included.

Referring now to FIG. 1, there is shown a block diagram of the character recognition system including a slot scanner 20 which causes a laser beam to be reflected to produce a scanned pattern above and in front of a slot or opening adjacent the laser. If a UPC (universal product code) tag or label is placed such that the laser beam crosses the tag, thereby reflecting the light from the bars and spaces which compose the UPC tag, a photodetector receiving the reflected light will transform the reflected light into an electrical signal. A video amplifier (not shown) located in the scanning unit generates, in response to the generated electrical signals, digital pulses $\overline{STV}$ (Set Video) indicating a space-to-bar transition and $\overline{RTV}$ (Reset Video) indicating a bar-to-space transition. The time interval between these pulses is a function of the width of the bar or space. The pulse width of the signals $\overline{STV}$ and $\overline{RTV}$ can be from 25 nans seconds to 2 microseconds. Alternate valid signals are never closer together than 350 ns. This means that following a valid $\overline{STV}$ or $\overline{RTV}$, multiple pulses may occur during this 350 ms. time period.

These time intervals are transmitted to a counter control 22 (FIG. 1) in which the intervals are converted to a binary number by an interval counter which is part of a FIFO (First-In, First-Out) IC array. The FIFO averages the time between intervals to an acceptable period. Either of the signals $\overline{STV}$ and $\overline{RTV}$ will stop the interval counter and cause that interval count along with the state of a VIDEO flip-flop (not shown) to be stored in a FIFO shift register (not shown). The VIDEO flip-flop will be "true" for a bar. The interval counter at this point is reset and the next interval count is started. If the output of the interval counter is greater than 1280 counts (32 us.), an overflow condition is created. In the overflow state, every 800 ns. of the count of 1280 and the last state of the VIDEO flip-flop will be loaded into the FIFO shift register. The occurrence of the next $\overline{STV}$ or $\overline{RTV}$ signal will result in the loading of an additional 1280 counts into the FIFO shift register. This condition will cause an error signal to be generated which, as will be described more fully hereinafter, will be sensed by the system at this time. Using this error signal, the system will disregard the data that is being generated by the slot scanner unit 20 and the counter control unit 22. The data contained in the FIFO shift registers located in the counter control 22 will be outputted to a decoder chip 24 (which is the subject of the present application) under the control of clock pulses generated by a 40 Mhz. oscillator 26. The FIFO shift registers will output 11 bits of binary data representing the width of the interval being scanned over bus 23 (FIG. 1) together with a VIDEO signal indicating whether the interval is a bar or a space. Also outputted from the counter control unit 22 to the decoder chip 24 are clock pulses CLK.

The decoder chip 24 (FIG. 1) contains a number of binary adders, comparators, shift registers and discrete logic elements which are used to decode the data being scanned by the slot scanner unit 20. The decoder chip 24 will output a hexadecimal number which includes four BCD bits representing a decimal character in addition to indicating margins, center bands and error. Three additional binary bits are outputted by the decoder chip 24 to represent the signal MARK to indicate whether the interval is a bar or a space, the signal EQUAL indicating that the current interval taken together with the three previous intervals are either equal or not equal in width to the previous four intervals and the signal PARITY indicating that the interval is either odd or even parity, thereby locating the interval on the left or right side of the center band.

The output signals from decoder chip 24 are transmitted to a frame control chip 28 (FIG. 1) which separates the valid data from invalid data being outputted by the decoder chip 24. The frame control chip 28 filters out this valid data by checking for framing characters, that is, in and out margins, in and out center bands, and character equality to identify or format the valid characters being decoded by the decoder chip 24. A good or properly formatted segment of valid data is then transmitted over bus 29 to a microprocessor 30 for further processing. The frame control chip 28 functions also as a communication adapter for transmitting data to be sent from the microprocessor through an interface adapter 32 to a host terminal 34 over bus 33. The microprocessor 30 monitors photo-detectors in the slot scanner unit 20 to determine when an item is in position to be read by the slot scanner. This data is transmitted to the microprocessor 30 over a bus 36 coupled to a scanner control unit 38. Upon receiving the required control signals, the microprocessor will then start monitoring the frame control chip 28 for information. The microprocessor does correlation analysis and a modulo ten check to determine if it has a valid tag. Once a valid tag is assembled, the data is transmitted to the host terminal through the interface adapter 32. Reference should be made to the co-pending application Blandford et al. Ser. No. 043,971 and Naseen et al. Ser. No. 043,928 filed on the same date as the present application for a full disclosure of the details of the operation of the frame control chip 28 and the microprocessor 30 respectively, each assigned to the present assignee of the application.

Figure 2:
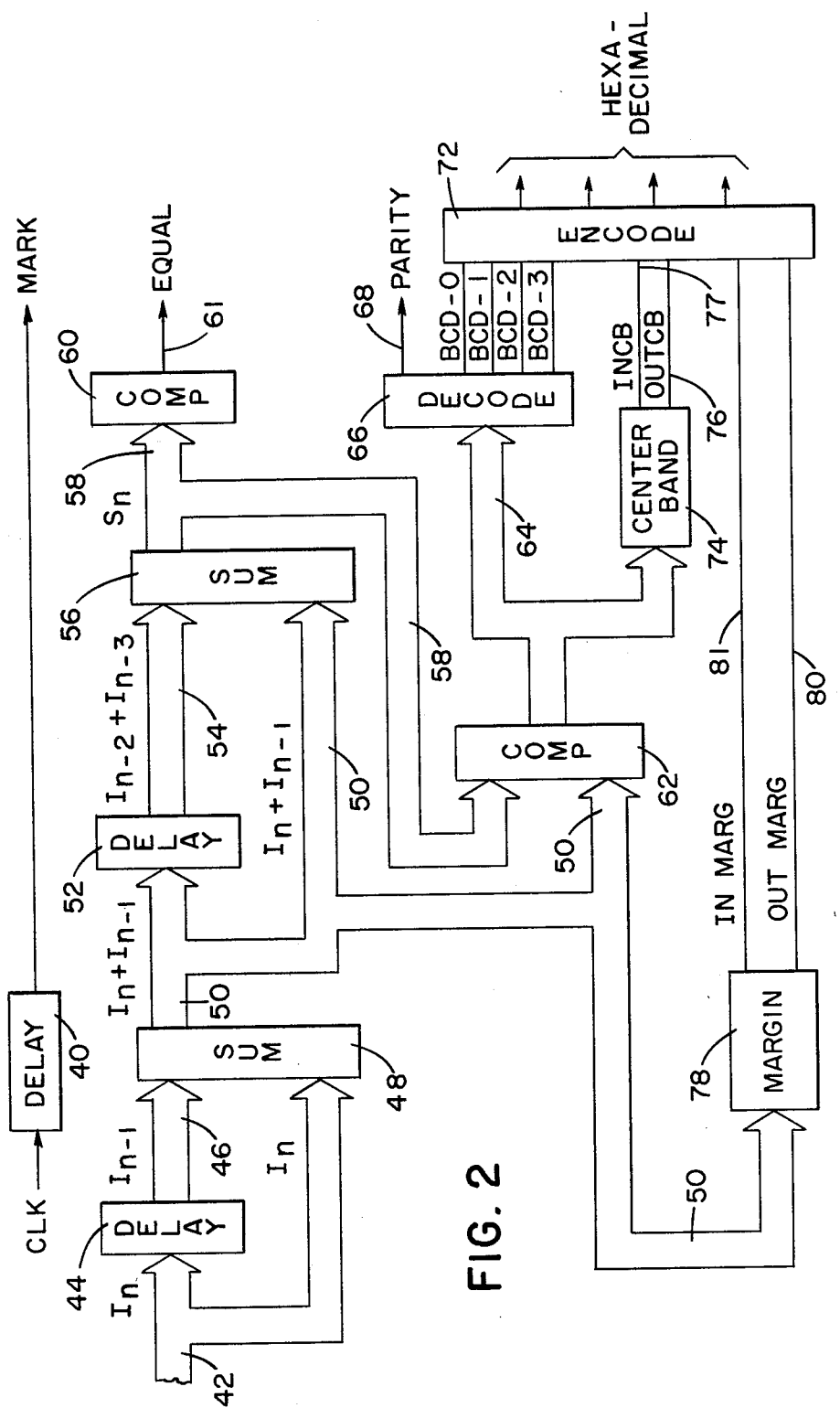
FIG. 2 is a block diagram of the circuitry of the integrated circuit pattern recognition array chip contained in the system of FIG. 1.

Referring now to FIG. 2, there is shown a block diagram of the logic circuits employed in the present embodiment for generating binary signals representing the terms mark, equality, parity and a hexadecimal number which may represent the interval as one of, or a part of, a 9 decimal character, the in center band, the out center band, the in margin or the out margin. As previously described, the counter control unit 22 (FIG. 1) will continually output binary data representing the width of the interval being scanned by the slot scanner unit 20 (FIG. 1). This binary data is in the form of an 11 bit wide binary word which is transmitted over bus 23 (FIG. 1) to the decoder chip 24. Also outputted at this time is a clock pulse CLK which, as shown in FIG. 2, is transmitted through a delay circuit 40 which delays the clock pulse a predetermined number of clock times so that the output pulse from the delay circuit 40 will correspond to the output of the logic circuits shown in FIG. 2 as a result of processing the interval which was generated with the clock pulse in the counter control circuit 22. The delayed clock pulse designated MARK identified whether the interval processed by the logic circuits was a space (binary 0) or a bar (binary 1). In the present embodiment, the delay is 12 clock pulses.

As will be described more fully hereinafter, the interval being outputted by the counter control unit 22 (FIG. 1) is transmitted to a latch member whose output will appear on bus 42 (FIG. 2). The current interval segment designated $I_N$ is transmitted over the 11 bit made bus 42 to a delay circuit 44 on whose output at this time will appear the previous interval $I_{N-1}$. This latter term is transmitted over bus 46 to the summing circuit 48 which adds the current interval $I_N$ with the previous interval $I_{N-1}$ to output over bus 50 the sum of the two consecutive intervals $I_N+I_{N-1}$. This latter term is transmitted to a two clock pulse delay circuit 52 on whose output appears the sum of the third and fourth previous intervals $I_{N-2}+I_{N-3}$, which term is transmitted over bus 54 to a summing circuit 56 to be added with the term $I_N+I_{N-1}$, the summing circuit 56 outputting over bus 58 the term $S_N$ which is the sum of the last four intervals scanned by the scanning unit 20 (FIG. 1). The sum $S_N$ is then compared in the comparator circuit 60 with the sum $S_N$ of the previous four intervals to determine if they are equal. If they are, the character being outputted at this by the logic circuit is valid. If not, the character is not valid. Since the logic circuits of FIG. 2 will output a character upon receiving the 11 binary bits of data representing the width of each interval, the binary bit representing the signal EQUAL and appearing on the output line 61 of the comparator circuit 60 designates whether the character is valid (binary 1) or invalid (binary 0).

The sum of the two intervals $I_N+I_{N-1}$ being outputted over bus 50 by the summing circuit 48 is also transmitted to a comparator circuit 62 which also receives over bus 58 the sum $S_N$ of the last four intervals to output over bus 64 data which is transmitted to a decoder circuit 66 which decodes the input data to generate over line 68 a bit indicating odd or even parity. The decoder circuit 66 will also output over lines 70 four BCD bits which are transmitted to an encoder circuit 72 which outputs a hexadecimal number which may represent one of the decimal characters 0–9 based upon the data transmitted to the encoder circuit 72 from the decoder circuit 66. The output data from the comparator circuit 62 is also transmitted over the bus 64 to a center band logic circuit 74 which will output over lines 76, 77 binary bits indicating whether the interval corresponds to the in center band or the out center band, which binary bits are transmitted to the encoder circuit 72 for inclusion in the hexadecimal number output. The sum of the two previous intervals $I_N+I_{N-1}$ is also transmitted over bus 50 to a margin logic circuit 78 which will output over lines 80, 81 binary bits designating the interval as part of the in margin or the out margin, which binary bits are transmitted to the encoder logic circuit 72 for inclusion in the hexadecimal number being outputted from the encoder circuit. Thus, the logic circuitry of the decoder chip 24 (FIG. 1) receives binary data bits representing the width of the intervals scanned plus a bit indicating a bar or space from the counter control unit 22 and decodes the data to output hexadecimal numbers which represent a decimal character, together with other characteristics of the interval for use by the system in recognizing the characters represented by the bar code scanned by the slot scanner unit 20.

Figure 3:
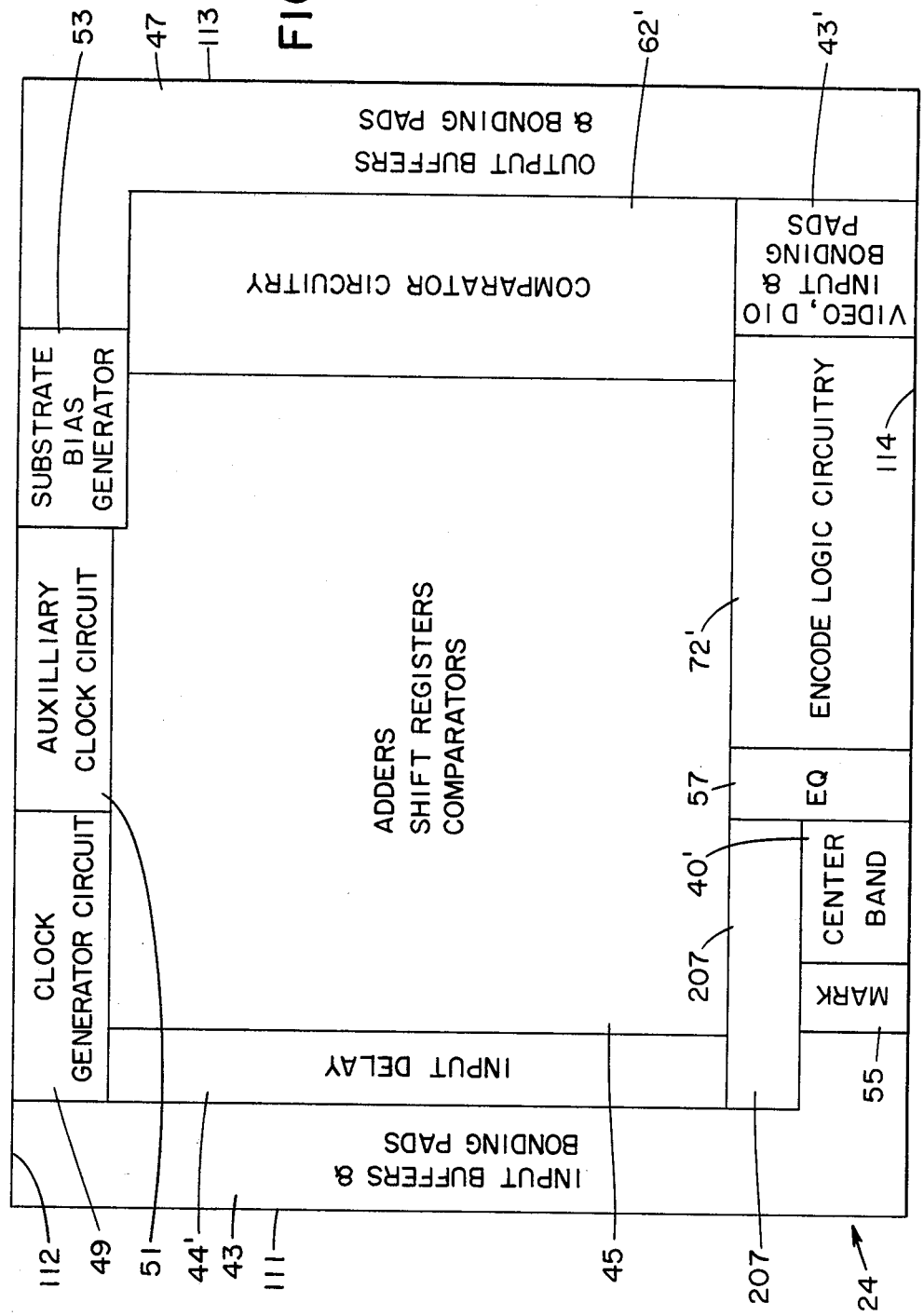
FIG. 3 is a block diagram illustrating the general location of the various sections of circuitry on the surface of the integrated circuit chip of the present invention.
Figure 4:
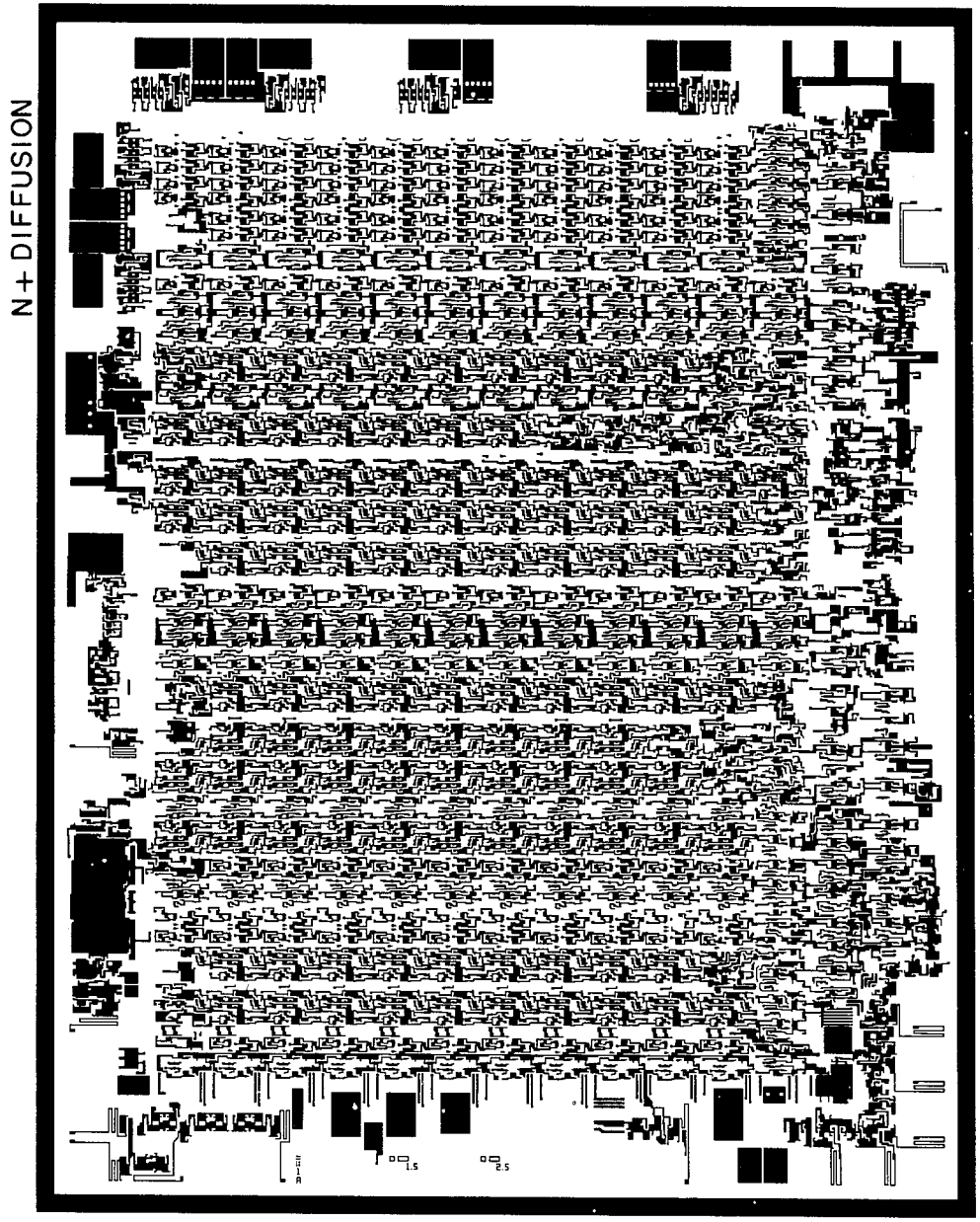
FIG. 4 is a scale reproduction of a photomask utilized to define the pattern of the source-drain diffused regions and diffused interconnection regions in the integrated circuit of the present invention.
Figure 5:
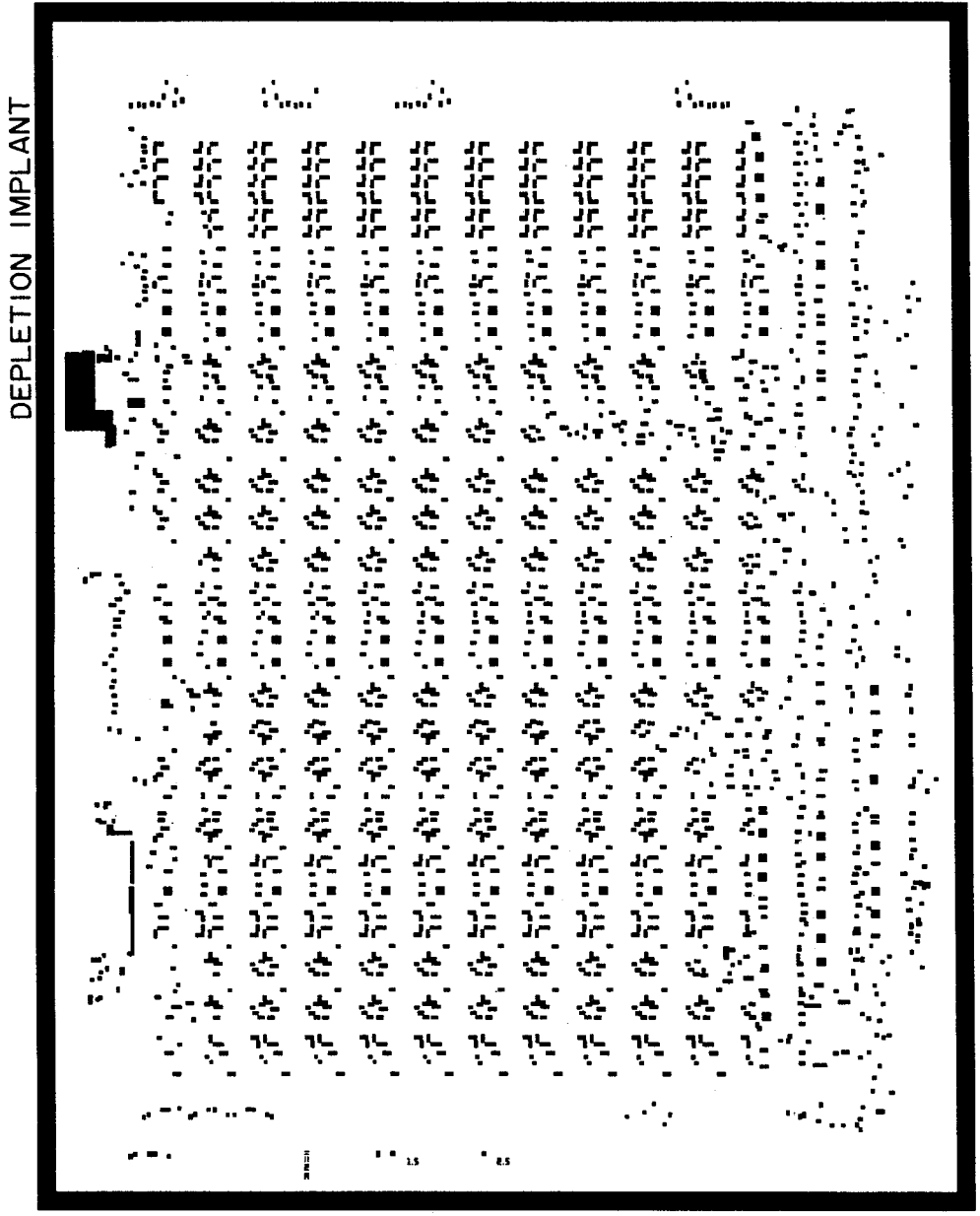
FIG. 5 is a scale reproduction of a photomask utilized to define the pattern of the ion implanted depletion regions of the integrated circuit chip of the present invention.

Referring now to FIG. 3, pattern recognition array chip 24 includes first edge 111, second edge 112, third edge 113 and fourth edge 114, sequentially positioned to form a rectangle.

Figure 7A:
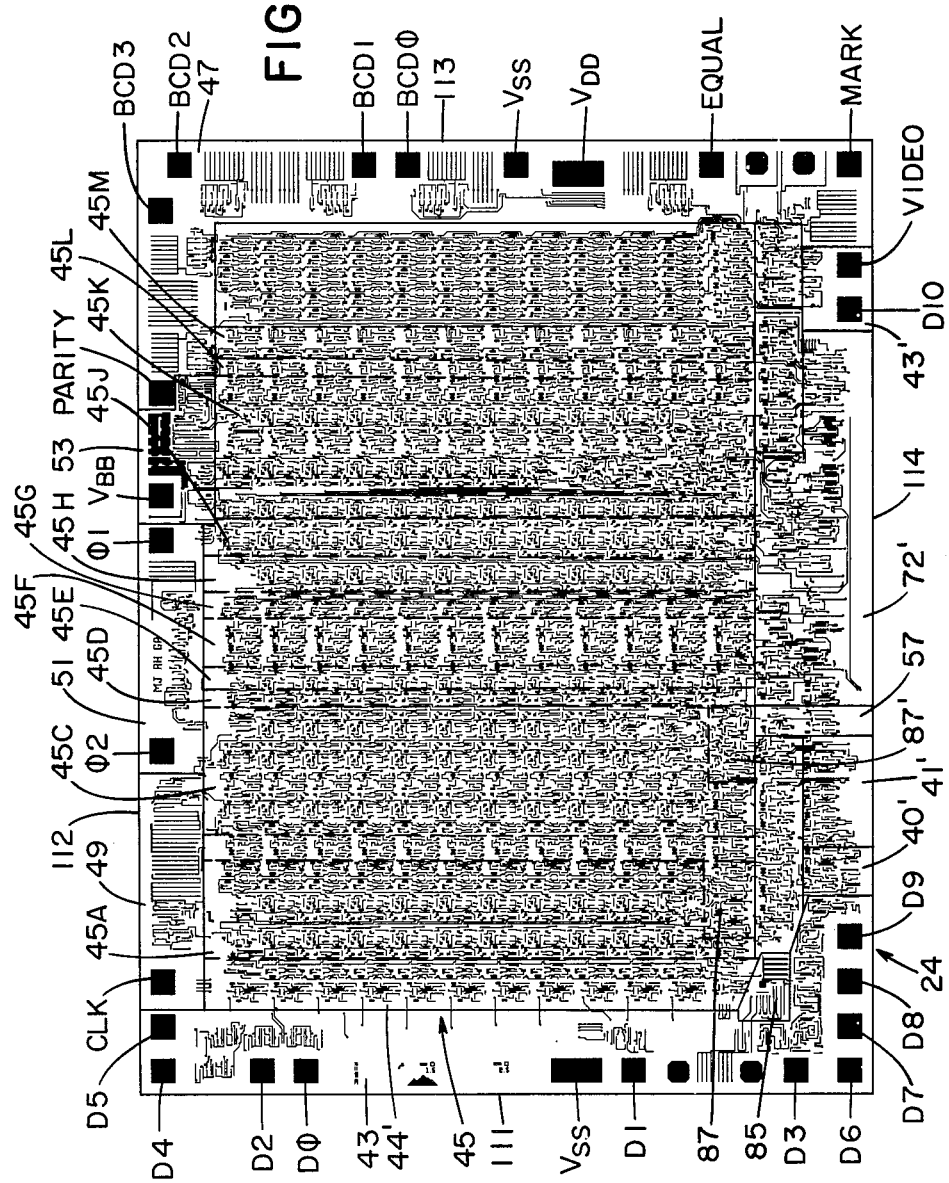
FIG. 7A is identical to FIG. 7 except that major sections of circuitry of the integrated circuit of the present invention have been outlined and identified by reference numerals.

Section 43 of pattern recognition array chip 24 includes an input buffer which receives bits D0–D9 of the binary number $I_N$ representing the most recently scanned interval, as described in the above mentioned co-pending application, Ser. No. 043,933. The bit D10 bonding pad appears in block 43' and the associated input buffer appears in block 43. The bit D10 bonding pad was placed in block 43' in order to allow convenient and reliable wire bonding thereof to the appropriate lead of the package (FIG. 11) in which chip 24 is housed. As shown in FIG. 7A, the bonding pads for inputs D0–D10 are included within the described blocks 43 and 43'. The close relative placement of the D0–D10 input circuitry in section 43 and the input delay circuitry in block 44' was due to the fact that the input signals have to reach the delay circuitry in section 45 without any degradation of voltage due to large amounts of interconnecting conductor capacitance and resistance which would result if sections 43 and 44' were not located closely to each other. The placement of the input circuitry in section 43 is partially influenced by bonding pad placement requirements of inputs D0–D10.

Figure 8:
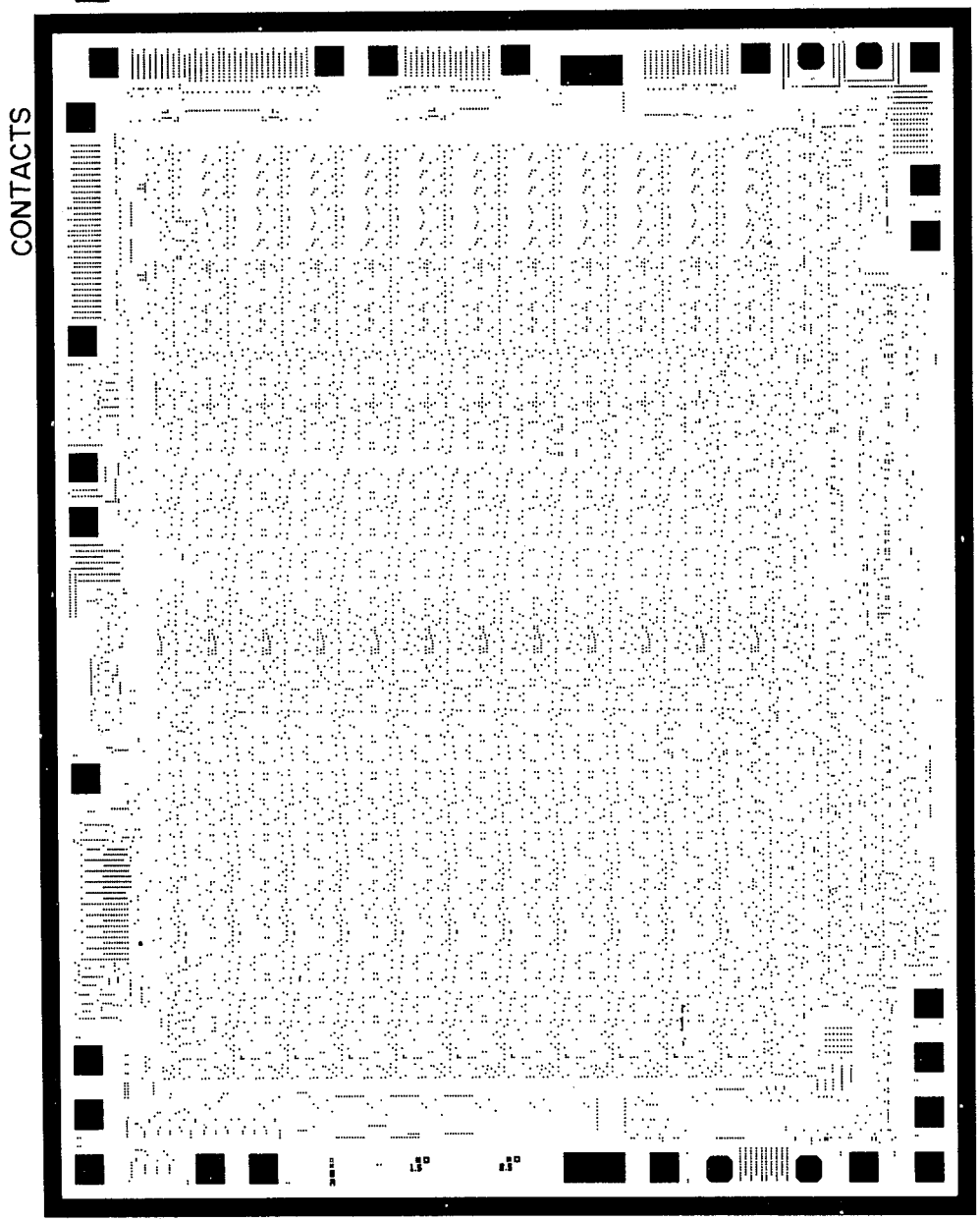
FIG. 8 is a scale reproduction of a photomask utilized to define all conductor interconnection contacts in the integrated circuit of the present invention.

Section 44' of pattern recognition array chip 24 includes a plurality of shift register delay elements which correspond to shift register 138 in FIG. 8A of co-pending application, Ser. No. 043,933. The interconnection conductors between the adders, shift registers and comparators was integrated into each logic cell to minimize the lengths of the interconnection conductors, thereby reducing their associated capacitances and resistances. The design of the adder cells required many interactions to achieve the optimum performance in the carry logic from cell to cell serially. Numerous capacitance and resistance calculations and modifications of the topography of the circuitry were made in order to achieve the necessary speed over the full length of the eleven bit carry chain. The first five bits of the ripple carry chain and sum logic were "fine tuned" to obtain the necessary speed.

A plurality of adders, shift registers, and comparators are contained in section 45, and perform the primary function of producing a four interval sum $S_n$ which appears on bus 58 in FIG. 2.

Comparator circuitry 62 of FIG. 2 is contained in block 62'. Output buffers, including those corresponding to the hexadecimal code bits BCD0–BCD3 and the PARITY, EQUAL and MARK bits are included in section 47. The corresponding bonding pads are also included in section 47 as shown in FIG. 7A.

The bonding pad receiving the previously described VIDEO signal is included in section 43', for the reasons previously stated. The input buffer associated with the VIDEO bonding pad is located in section 43.

The inputs of the individual comparator circuits in comparator circuitry block 62' are received from various shift registers and adders contained in section 45, as can be seen by reference to FIG. 2 and to the more detailed figures in co-pending application, Ser. No. 043,933. The outputs of the individual comparator circuits in section 62' are fed into the encode logic circuitry in section 72', which corresponds to the circuitry contained in blocks 72 and 66 in FIG. 2. The encode circuitry is located along the fourth edge of the pattern recognition chip 28, as shown in FIG. 3.

Circuitry utilized in generating the EQUAL signal is contained in section 57, located along the fourth edge of FIG. 3. Circuitry utilized in generating the center band signals which are fed into block 72' are contained in section 40' and are received from circuitry in section 45. Circuitry utilized in generating the MARK signal receives inputs from circuitry in section 45, and is located in section 55 in FIG. 3.

Figure 9:
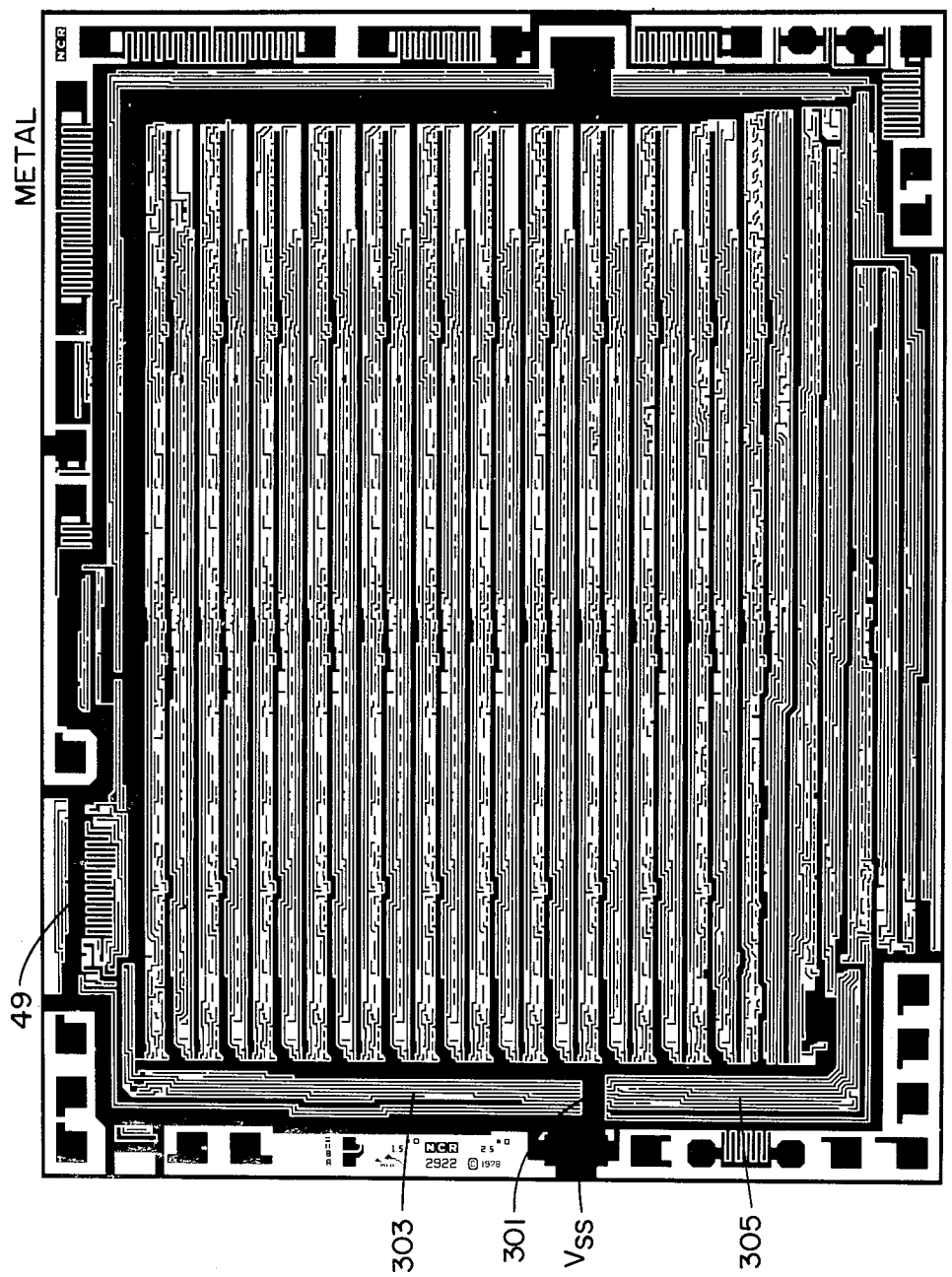
FIG. 9 is a scale reproduction of a photomask utilized to define the pattern for the metal interconnection layer of the integrated circuit of the present invention.
Figure 10:
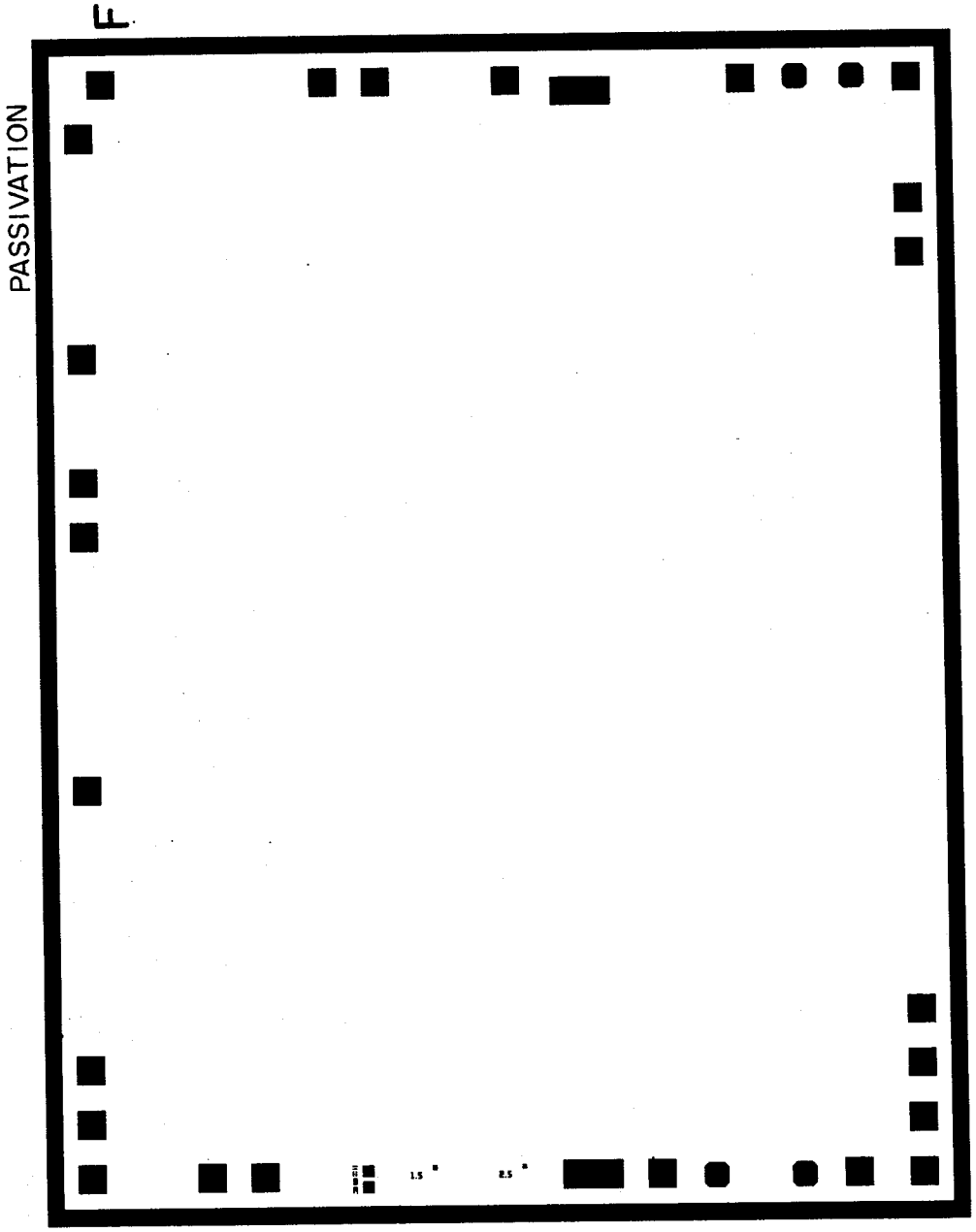
FIG. 10 is a scale reproduction of a photomask utilized to define the pattern for the passivation layer of the integrated circuit of the present invention.

The clock generator circuit contained in section 49 in FIG. 3 is located along edge 112, near the upper left hand corner of the chip. The "phase one" and "phase two" output conductors of the clock generator in section 49 are routed so that they are equally balanced in that they have equal distributed resistance and capacitance as they enter the input delay section 44', section 45, adder, shift register and comparator circuitry in sections 55, 45, 57, 72' and 43' and the lower part of section 62'. The $V_{SS}$ power bus shown in FIG. 9 includes a short, wide horizontal section or bar 301 which branches out and feeds the internal portion of chip 24. The "phase one" and "phase two" output signals produced by clock generator circuit 49 are fed through region 303 and through a diffused cross-under beneath $V_{SS}$ metal bar 301 and into section 305. Due to the resistances of the diffused crossunder, the clock signals below metal bar 301 in FIG. 9 are delayed with respect to the clock signals on the same respective conductors above the $V_{SS}$ bar 301. The location of the $V_{SS}$ bar 301 was selected because the delay of clock signals to bits 9–11 in the circuitry of blocks 40', 55, 57, 72' and bits 9–11 in section 44' is acceptable, whereas it is not acceptable for bits 0–8 in section 44'. It should be noted that this consideration strongly influenced the placement of clock generator circuitry 49 in the upper left hand corner of chip 24 and placement of the circuitry of blocks 40', 55, 57, and 72' along the lower edge of chip 24. Auxiliary clock circuitry in section 51 was included on chip 28 as an optional circuit which ultimately was not utilized. Similarly, substrate bias generator circuitry in section 53 was included to bias the substrate in order to obtain suitable circuit operation. This circuitry was located along with section 51 along edge 112 simply because this section of chip area was available due to the above described positioning of section 49.

FIG. 7A discloses the sections shown in FIG. 3 outlined out on the scale reproduction of the photomask used to define the pattern of the polycrystalline silicon layer of pattern recognition array chip 24, and further includes several additional blocks identifying locations of additional sections of circuitry of pattern recognition array chip 24.

More particularly, section 45 includes a plurality of sections including section 45A, which contains circuitry which identifies the in margin and out margin of the bar coded label described in the above referenced patent applications and identified by reference numeral 78 in FIG. 2. This block of circuitry (section 45A) includes adder circuit 214 of FIG. 8C, adder circuit 342 of FIG. 8K, comparator 340 of FIG. 8F and comparator 362 of FIG. 8K of co-pending application, Ser. No. 043,933.

Reference numeral 45B includes comparator circuitry 174 of FIG. 8E, adder circuitry 196 of FIG. 8E, shift registers 188 and 192 of FIG. 8D, and adders 198 and 202 of FIG. 8D of copending application, Ser. No. 043,933. This section of circuitry (identified by reference numeral 45C) is utilized to decode the ambiguous states described in co-pending application, Ser. No. 043,933.

Reference numeral 45D includes circuitry designated by reference numeral 218 in FIG. 8C and reference numeral 220 of FIG. 8D of Ser. No. 043,933. Sections 45E, 45G, 45J and 45L include circuitry for generating the EQUAL signal on conductor 61 in FIG. 2. Specifically, section 45E includes adder 256 of FIG. 8F, section 45G contains comparator 310 of FIG. 8I, and section 45J includes adder 284 of FIG. 8H, all of Ser. No. 043,933. Section 45H includes shift register circuitry identified by reference numerals 260 and 308 in FIGS. 8G and 8H of Ser. No. 043,933. Section 45K includes adder circuitry identified by reference numerals 274 and 278 in FIG. 8G and reference numerals 884 and 324 in FIG. 8H of Ser. No. 043,933. Section 45M includes shift register circuitry.

Block 85 in FIG. 7A includes circuitry for generating a "recirculate" or delayed "phase two" clock which is circulated throughout the circuitry in chip 28 to insure that the dynamic nodes attain and maintain their proper logic levels. Blocks 87 and 87' include circuitry which contributes to decoding of the previously mentioned ambiguous states. The positioning of the recirculate clock generating circuitry in block 85, FIG. 7A was influenced by a desire to place this circuitry as far as possible from the clock generator circuitry in section 49 in order to take advantage of the delay associated with the clock signal conductor lengths between sections 85 and 49.

A substantial reduction in chip area is achieved in part by locating the encoder logic in section 72' along the bottom of the chip rather than between the output buffers in section 47 and the comparators in section 62' even though additional routing from the outputs of the comparators in section 62' is required leading to the inputs of the encoder logic in section 72' and from the outputs of encoder logic in section 72' back to the inputs of the various output buffers in section 47.

Placement of the comparators in section 62' outside and to the right of section 45 increased the length of conductors from circuitry within section 45 to the inputs of the comparators in section 62', but resulted in lower capacitance of various clock lines distributed through section 45 and other portions of the chip 28, since the comparator circuitry in section 62' does not require connection to the main clock signals. Placement of section 62' near the right edge of the chip therefore avoided the necessity of routing the clock lines across section 62' thereby shortening their length and thereby their capacitance.

The general location of sections 62', 72' and 47 was also influenced by bonding pad placement requirements of the hexadecimal, EQUAL and MARK out drivers.

The circuitry included in sections 40', 55 and 57 could easily have been included in section 45. However, this would have increased the lengths of edges 112 and 114. The inefficiency of distributing circuitry in section 72' along the edge 114 in order to utilize space now occupied by sections 40', 55, and 57 would have resulted in inefficient use of chip area. The configuration shown in FIG. 3 resulted in a substantial decrease in the length of edges 112 and 114 at the cost of a very small increase in the length of edges 111 and 113. A number of miscellaneous shift register circuits and other logic circuits which could have been included in section 45 are included in section 207 because placement of sections 40', 55, and 57 and 72' made this area available, allowing a further decrease in the length of edges 112 and 114.

It should be noted that the locations of the various bonding pads were selected so that chip 24, chip 28 of co-pending application, Ser. No. 43,930, and the microprocessor 86 in FIG. 2 of Ser. No. 43,930 can be conveniently connected on a printed circuit board. The resulting bonding pad placements strongly influenced the placement of input and output circuitry in both chip 24 and chip 28.

It should be noted that those skilled in the art can prepare a mask set for manufacturing chip 28 on the basis of the scale reproductions of the photomasks in FIGS. 4–10.

The chip 24, shown in FIG. 3 of the present application, and chip 28, described in co-pending application Ser. No. 43,930, can be combined on a single integrated circuit chip by placing edge 114 of chip 28 in co-pending application Ser. No. 43,930 against edge 112 of chip 24 in the present application and eliminating the output buffers and bonding pads in section 47 of chip 24 and also eliminating the input buffers in section 57 of chip 28 of Ser. No. 43,930. The signals generated by encode logic circuitry in section 72 of chip 24 are then routed directly to the inputs of section 51 of chip 28 of Ser. No. 43,930. Bonding pads along edge 112 of chip 24 and along the bottom of edge 114 of chip 28 and routed to the common right hand edge of the composite chip.

Although the invention has been described with reference to a particular detailed layout of the pattern recognition array chip, certain variations can be made by those skilled in the art without departing from the true spirit and scope of the invention as defined in the appended claims.

We claim:

1. An integrated circuit for sequentially receiving a plurality of binary interval numbers each representing the width of a time interval occurring during optical scanning of a bar coded label, the integrated circuit receiving a plurality of signals each representing whether a respective one of the time intervals is a bar or a space, said integrated circuit comprising in combination:
  a. first means for receiving and storing said binary interval numbers;
  b. second means for adding predetermined ones of said stored binary interval numbers and storing the resulting sums;
  c. third means responsive to said first and second means for comparing predetermined ones of said sums and said stored resulting sums to produce a plurality of intermediate logic signals;
  d. fourth means responsive to said third means for encoding predetermined ones of said intermediate logic signals to produce a digital character number representing a character scanned on the bar encoded label; and
  e. output means for outputting said digital character number;

said integrated circuit having first, second, third and fourth sequentially located edges, said first means being located substantially closer to said first edge than to said third edge to reduce lengths of conductors conducting signals representing said binary interval numbers from respective input pads which are located along said first edge, said third means being located substantially closer to said third edge than to said first edge, said second means being located generally between said first means and said third means to reduce capacitances of clock signal conductors which are distributed through said second means, said fourth means being located substantially closer to said fourth edge than to said second edge to reduce the lengths of said second and fourth edges, wherein said first means includes a plurality of bonding pads and input buffer means for receiving said binary interval numbers and first delay means coupled to said input buffer means for temporarily storing and delaying binary interval numbers received by said bonding pads, said first delay means being located between said input buffer means and said second means immediately adjacent to said input buffer means in order to avoid degradation of voltage of input signals transmitted from said input buffer means to said delay means, said integrated circuit including clock signal generating means for producing clock signals to be distributed to various portions of said integrated circuit and a metal power bus connected to a bonding pad, said metal power bus extending from a location adjacent to said first edge through said first means to said second means between upper and lower portions of said power means, said clock signals being conducted on metal conductors and diffused crossunders which pass beneath the portion of said metal power bus extending through said first means, the placement of said portion of said metal power bus extending through said first means being selected to avoid delay of certain of said clock signals to circuitry in each upper portion of said first means.

2. The integrated circuit of claim 1 wherein said binary interval numbers are represented by $I_n$, $I_{n-1}$, $I_{n-2}$, etc., where n, n−1, n−2 represent nth, n−1th, n−2th, etc. time frames, said second means including first adding means having inputs connected to said bonding pads and the output of said first delay means, said bonding pads having a binary interval number $I_n$ thereon, the outputs of said first delay means having a binary interval number $I_{n-1}$ thereon, said first adding element producing a binary number equal to $I_n + I_{n-1}$ said second means also including second delay means having inputs connected to the outputs of said first adding means, an output of said second delay means producing a binary number $I_{n-2} + I_{n-3}$, said second means including second adding means having inputs connected to the output of said first adding means, the outputs of said second delay means and producing a binary number equal to $I_n + I_{n-1} + I_{n-2} + I_{n-3}$.

3. The integrated circuit of claim 2 wherein the number of bits of said binary interval number is equal to 11, one bit of said first delay means being located adjacent the corner between said third and fourth edges.

4. The integrated circuit of claim 2 further including margin circuitry for decoding predetermined ones of the said binary numbers to determine whether the bar coded label was scanned from left to right or right to left, said margin circuitry being located in said second means nearer to said first edge than to said third edge.

5. The integrated circuit of claim 4 wherein said output means includes four output buffers and four bonding pads respectively connected thereto for outputting four binary coded decimal characters, said four output buffers being generally located adjacent the corner between said second and third edges.

6. The integrated circuit of claim 5 further including circuitry responsive to said second adding means for producing a signal indicative of whether the most recent four interval sum is equal to the four interval sum of the last valid character encoded by such integrated circuit, said circuitry being located adjacent to said center band circuitry which is adjacent said fourth edge.

7. The integrated circuit of claim 4 wherein the bar coded label is a universal product code label having a right center band and a left center band, said integrated circuit including outer band circuitry for decoding information produced in response to optical scanning of the right and left outer bands to identify the type of character scanned, the center band circuitry being located adjacent said fourth edge.

* * * * *